(12) United States Patent
Yang et al.

(10) Patent No.: US 9,024,583 B2
(45) Date of Patent: May 5, 2015

(54) BATTERY PACK WITH ANALOG SWITCH

(75) Inventors: Jongwoon Yang, Yongin-si (KR);
Susumu Segawa, Yongin-si (KR);
Euijeong Hwang, Yongin-si (KR);
Beomgyu Kim, Yongin-si (KR); Jinwan Kim, Yongin-si (KR); Hanseok Yun, Yongin-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 839 days.

(21) Appl. No.: 13/023,531

(22) Filed: Feb. 8, 2011

(65) Prior Publication Data

US 2011/0193526 A1 Aug. 11, 2011

Related U.S. Application Data

(60) Provisional application No. 61/303,602, filed on Feb. 11, 2010.

(51) Int. Cl.

| | |
|---|---|
| *H02J 7/00* | (2006.01) |
| *H01M 10/44* | (2006.01) |
| *H01M 10/48* | (2006.01) |
| *H01M 10/42* | (2006.01) |
| *G01R 31/36* | (2006.01) |
| *H01M 10/0525* | (2010.01) |

(52) U.S. Cl.
CPC ......... *H01M 10/441* (2013.01); *G01R 31/3658* (2013.01); *H01M 10/0525* (2013.01); *H01M 10/482* (2013.01); *H02J 7/0014* (2013.01); *H02J 2007/0067* (2013.01); *H01M 10/425* (2013.01); *H02J 7/0016* (2013.01); *G01R 31/3675* (2013.01)

(58) Field of Classification Search
USPC .................. 320/112, 116, 118, 123; 324/434
See application file for complete search history.

(56) References Cited

U.S. PATENT DOCUMENTS 7,592,774 B2   9/2009  Morimoto
7,714,540 B2 *  5/2010  Shibuya et al. ............... 320/119
(Continued)

FOREIGN PATENT DOCUMENTS

CN   101414759 A   4/2009
JP   02-091576   3/1990
(Continued)

OTHER PUBLICATIONS

SIPO Office Action dated Mar. 5, 2013 for CN Application No. 2011-10037649.7 (5 pages).
(Continued)

*Primary Examiner* — Richard V Muralidar
(74) *Attorney, Agent, or Firm* — Christie, Parker & Hale, LLP

(57) ABSTRACT

An analog switch and a battery pack using the same are provided. The analog switch can compensate for temperature dependence of voltages measured from a battery cell before applying the measured voltages to an analog-to-digital (A/D) converter. In an embodiment of the analog switch, a first diode is coupled in a backward direction from a flying capacitor, which is coupled to the A/D converter, to correspond to a second diode packaged therewith as a single set. The first diode is positioned in a battery cell voltage input path to store battery cell voltage values in the flying capacitor, while the second diode suppresses a temperature-related difference caused by the first diode to voltages measured from the battery cell.

15 Claims, 4 Drawing Sheets

(56) References Cited

U.S. PATENT DOCUMENTS

| | | |
|---|---|---|
| 2005/0242667 A1 | 11/2005 | Emori et al. |
| 2007/0108940 A1 | 5/2007 | Sainomoto et al. |
| 2007/0268000 A1 | 11/2007 | Kobayashi et al. |
| 2008/0164882 A1 | 7/2008 | Jaeger et al. |
| 2008/0303585 A1 | 12/2008 | Kawashima |
| 2008/0309317 A1 | 12/2008 | Chen et al. |
| 2009/0096420 A1 | 4/2009 | Lupu et al. |

FOREIGN PATENT DOCUMENTS

| | | |
|---|---|---|
| JP | 02-103474 | 4/1990 |
| JP | 06-314932 | 11/1994 |
| JP | 10-094190 | 4/1998 |
| JP | 2000-340267 A | 12/2000 |
| JP | 2005-091136 A | 4/2005 |
| JP | 2005-292137 A | 10/2005 |
| JP | 2005-300195 | 10/2005 |
| JP | 2006-220643 * | 8/2006 |
| JP | 2006-220643 A | 8/2006 |
| JP | 2007-143284 | 6/2007 |
| JP | 2008-306857 | 12/2008 |
| WO | WO 2009-096228 A1 | 8/2009 |

OTHER PUBLICATIONS

Japanese Office Action dated May 23, 2012 of the corresponding Japanese Patent Application No. 10-2011-0011870, 5 pages.
English machine translation of JP 2005 300195, 10 pages.
Machine English Translation of JP 06-314932.
Machine English Translation of JP 10-094190.
EPO Search Report dated Jul. 23, 2013, for corresponding European Patent application 11250149.9, (6 pages).
Machine English Translation of JP 2000-340267 A, 7 pages.
Machine English Translation of JP 2005-091136 A, 14 pages.
Machine English Translation of JP 2005-292137 A, 14 pages.
Machine English Translation of JP 2006-220643 A, 26 pages.

* cited by examiner

BATTERY PACK WITH ANALOG SWITCH

CROSS-REFERENCE TO RELATED APPLICATION(S)

This application claims priority to and the benefit of U.S. Provisional Application No. 61/303,602, filed in the United States Patent and Trademark Office on Feb. 11, 2010, the entire content of which is incorporated herein by reference.

BACKGROUND

1. Field

Aspects of embodiments according to the present invention relate to a battery pack.

2. Description of Related Art

In general, a portable electronic apparatus, such as a portable notebook computer or a portable electrical device, includes a rechargeable battery pack. The battery pack may include a plurality of battery cells, a voltage sensing and balancing circuit for sensing voltages of the respective battery cells and for maintaining voltage balance, and a controller for controlling charging and discharging operations of the respective battery cells.

In a battery pack mounted in a special device such as a handheld electrical device, some of battery cells constituting the battery pack are coupled to a voltage sensing and balancing circuit and measured. However, since the voltage sensing and balancing circuit has only a limited number of input ports, it may be that not all of the battery cells can be coupled to the voltage sensing and balancing circuit. Generally, the battery cells are directly coupled to an analog-to-digital (A/D) converter provided within the controller to transfer voltages thereof.

SUMMARY

Aspects of embodiments according to the present invention are directed to a battery pack that can compensate for temperature dependence of voltages measured from a battery cell and applying the same to an analog-to-digital converter.

An embodiment of the present invention provides for a battery pack including a first diode coupled in a backward direction from a flying capacitor, which is coupled to an analog-to-digital (A/D) converter, to correspond to a second diode packaged therewith as a single set. The first diode is positioned in a battery cell voltage input path to store battery cell voltage values in the flying capacitor. The second diode thereby suppresses a difference between voltages measured from battery cells depending on temperature characteristics of the first and second diodes.

An embodiment of the present invention also provides a battery pack including first and second diodes having the same temperature characteristics by packaging the first and second diodes as a single set.

An embodiment of the present invention also provides a battery pack including a first diode coupled in a backward direction to correspond to a second diode packaged therewith as a single set, the first diode preventing surge current from a voltage supply in a voltage input path from a flying capacitor to an A/D converter.

In the battery pack according to embodiments of the present invention, a first diode is coupled in a backward direction from a flying capacitor, which is coupled to an A/D converter, to correspond to a second diode packaged therewith as a single set. The first diode is positioned in a battery cell voltage input path to store battery cell voltage values in the flying capacitor, thereby suppressing a difference between voltages measured from battery cells depending on temperature characteristics of the first and second diodes.

In addition, in an embodiment of the battery pack according to embodiments of the present invention, a first diode is coupled in a backward direction to correspond to a second diode packaged therewith as a single set, the first diode for preventing surge current from a voltage supply in a voltage input path from a flying capacitor to an A/D converter, thereby suppressing a difference between voltages measured from battery cells depending on temperature characteristics of the first and second diodes.

According to an exemplary embodiment of the present invention, an analog switch is provided. The analog switch includes first and second inputs, an output, a flying capacitor, and first and second diodes. The first input is configured to couple to a first terminal of a battery. The second input is configured to couple to a second terminal of the battery. The output is configured to couple to an analog-to-digital (A/D) converter. The flying capacitor has a first terminal coupled to the first input and a second terminal coupled to the second input. The first diode includes an anode coupled to the second input and a cathode coupled to the second terminal of the flying capacitor. The second diode includes an anode coupled to a first capacitor for storing a supply voltage, and a cathode coupled to the second terminal of the flying capacitor.

The first diode and the second diode may have substantially the same temperature characteristics.

The analog switch may further include third and fourth inputs. The third input is configured to receive a first control signal for controlling voltage sensing of the battery. The fourth input is configured to receive a second control signal for controlling voltage transfer to the A/D converter.

The flying capacitor may be configured to store a voltage corresponding to a sum of a voltage between the first and second terminals of the battery and a forward voltage of the first diode in response to the first control signal.

The flying capacitor may be configured to transfer a voltage corresponding to a sum of the voltage between the first and second terminals of the battery, the forward voltage of the first diode, and the supply voltage minus a reverse voltage of the second diode to the A/D converter in response to the second control signal.

The forward voltage of the first diode may be substantially the same in magnitude as the reverse voltage of the second diode.

The analog switch may further include first through third transistors. The first transistor includes a first electrode coupled to ground, a second electrode, and a control electrode coupled to the third input. The second transistor includes a first electrode coupled to the first input, a second electrode coupled to the first terminal of the flying capacitor, and a control electrode coupled to the second electrode of the first transistor. The third transistor includes a first electrode coupled to the cathode of the first diode, a second electrode coupled to the second terminal of the flying capacitor, and a control electrode coupled to the second electrode of the first transistor.

The analog switch may further include a first voltage divider. The first voltage divider includes first and second resistors. The first resistor is coupled between the control electrode of the first transistor and the third input. The second resistor is coupled between the control electrode of the first transistor and the first electrode of the first transistor.

The analog switch may further include fourth and fifth transistors. The fourth transistor includes a first electrode coupled to ground, a second electrode, and a control electrode coupled to the fourth input. The fifth transistor includes a first electrode coupled to the first terminal of the flying capacitor, a second electrode coupled to the output, and a control electrode coupled to the second electrode of the fourth transistor.

The analog switch may further include a second voltage divider. The second voltage divider includes third and fourth resistors. The third resistor is coupled between the control electrode of the fourth transistor and the fourth input. The fourth resistor is coupled between the control electrode of the fourth transistor and the first electrode of the fourth transistor.

The analog switch may further include a second capacitor coupled to the first input.

The first and second diodes may be in a same package.

According to another exemplary embodiment of the present invention, a battery pack is provided. The batter pack includes a plurality of first battery cells, a voltage sensing and balancing circuit, a second battery cell, a controller, and an analog switch. The plurality of first battery cells is coupled to each other. The voltage sensing and balancing circuit includes a plurality of input terminals, and is configured to sense voltages and to maintain voltage balance of the plurality of first battery cells. The second battery cell is coupled to the plurality of first battery cells. The controller includes an analog-to-digital (A/D) converter and is configured to control charging and discharging of the battery cells. The analog switch is configured to sense and store a voltage of the second battery cell and to transfer the voltage to the A/D converter of the controller. The analog switch includes a flying capacitor and first and second diodes. The flying capacitor has a first terminal coupled to a first terminal of the second battery cell and a second terminal coupled to a second terminal of the second battery cell. The first diode includes an anode coupled to the second terminal of the second battery cell and a cathode coupled to the second terminal of the flying capacitor. The second diode includes an anode coupled to a capacitor for storing a supply voltage, and a cathode coupled to the second terminal of the flying capacitor.

The first and second diodes may have substantially the same temperature characteristics.

The battery pack may further include discharging and charging terminals, a negative electrode terminal, and a communications terminal. The discharging terminal is configured to discharge the battery cells. The charging terminal is configured to charge the battery cells. The negative electrode terminal is coupled to a negative terminal of the battery cells. The communications terminal is configured for single wire communication with an external device.

The battery pack may further include an overcharge preventing member between the battery cells and the charging terminal.

The overcharge preventing member may include a fuse.

The overcharge preventing member may include a heat resistor and a switch controlled by the controller.

The first and second diodes may be in a same package.

According to yet another exemplary embodiment of the present invention, a battery pack is provided. The battery pack includes a plurality of battery cells, a voltage sensing circuit, a flying capacitor, and a controller. The plurality of battery cells includes first through (N−1)th battery cells and an Nth battery cell. The voltage sensing circuit is configured to sense voltages of the first through (N−1)th battery cells. The flying capacitor is configured to sense a voltage of the Nth battery cell. The controller is configured to control storage of the Nth battery cell voltage in the flying capacitor and to control reading of the Nth battery cell voltage from the flying capacitor.

BRIEF DESCRIPTION OF THE DRAWINGS

The accompanying drawings, together with the specification illustrate exemplary embodiments of the present invention, and, together with the description, serve to explain the principles of aspects of the present invention.

DESCRIPTION OF SOME OF THE REFERENCE CHARACTERS IN THE DRAWINGS

Figure 1:
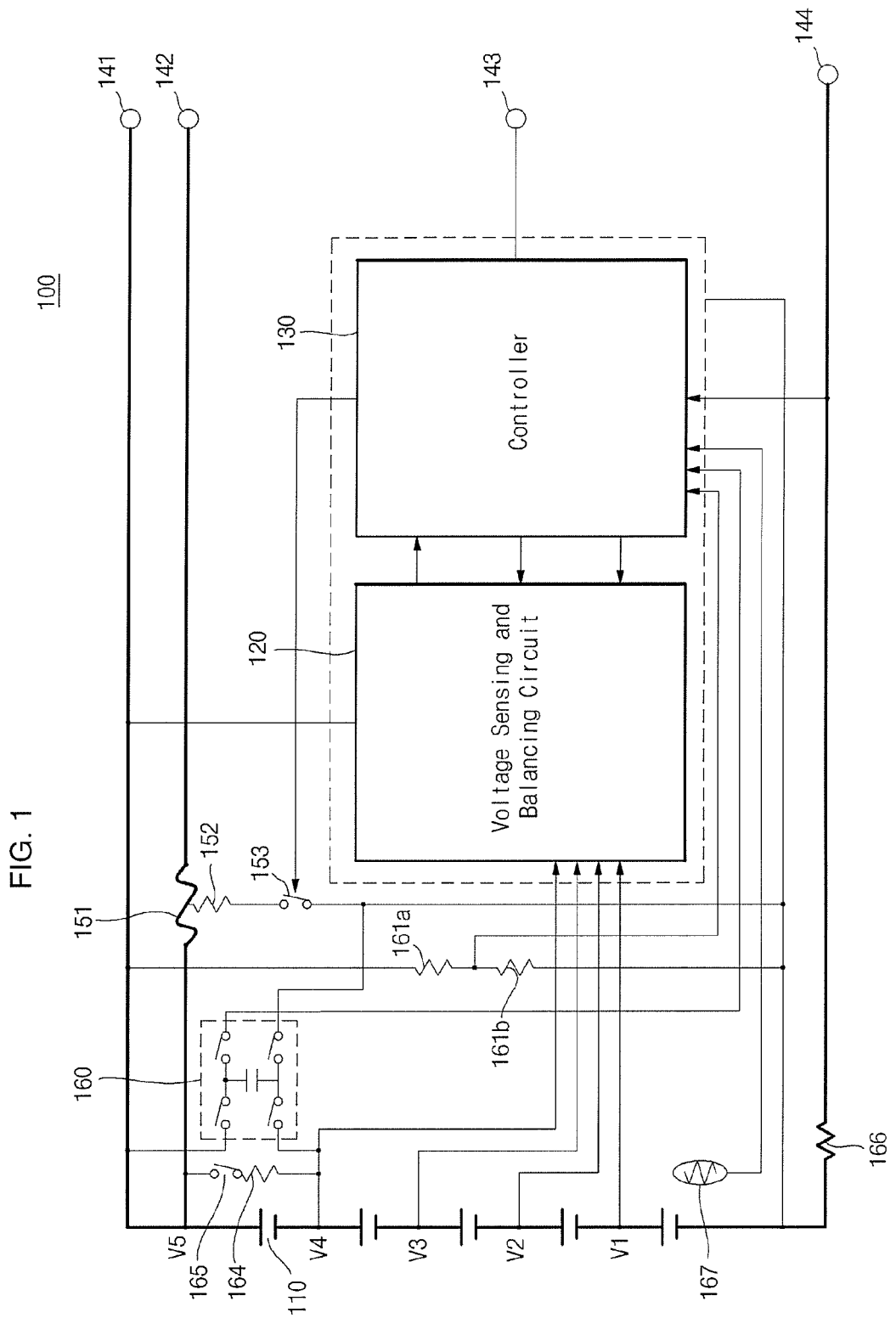
FIG. 1 a block diagram illustrating the structure of a battery pack according to an aspect of the present invention.

| | |
|---|---|
| 100: Battery pack | |
| 110: Battery cell | 120: Voltage sensing and balancing circuit |
| 130: Controller | 141: Discharging terminal |
| 142: Charging terminal | 143: Communication terminal |
| 144: Negative electrode terminal | 151: Fuse |
| 152: Heat resistor | 153: Switch |
| 160: Analog switch | 161a, 161b: Voltage dividing resistor |
| 164: Balancing resistor | 165: Balancing switch |
| 166: Current sensing resistor | 167: Thermal sensor |

DETAILED DESCRIPTION

Exemplary embodiments of the present invention will be described in detail with reference to the accompanying drawings so that it can be practiced or carried out by one skilled in the art. In addition, when an element is referred to as being "connected to" or "coupled to" another element, it can be directly connected to the another element or be indirectly connected to the another element with one or more intervening elements interposed therebetween. Hereinafter, like reference numerals refer to like elements.

Hereinafter, a structure of a battery pack according to an embodiment of the present invention will be described.

Figure 2:
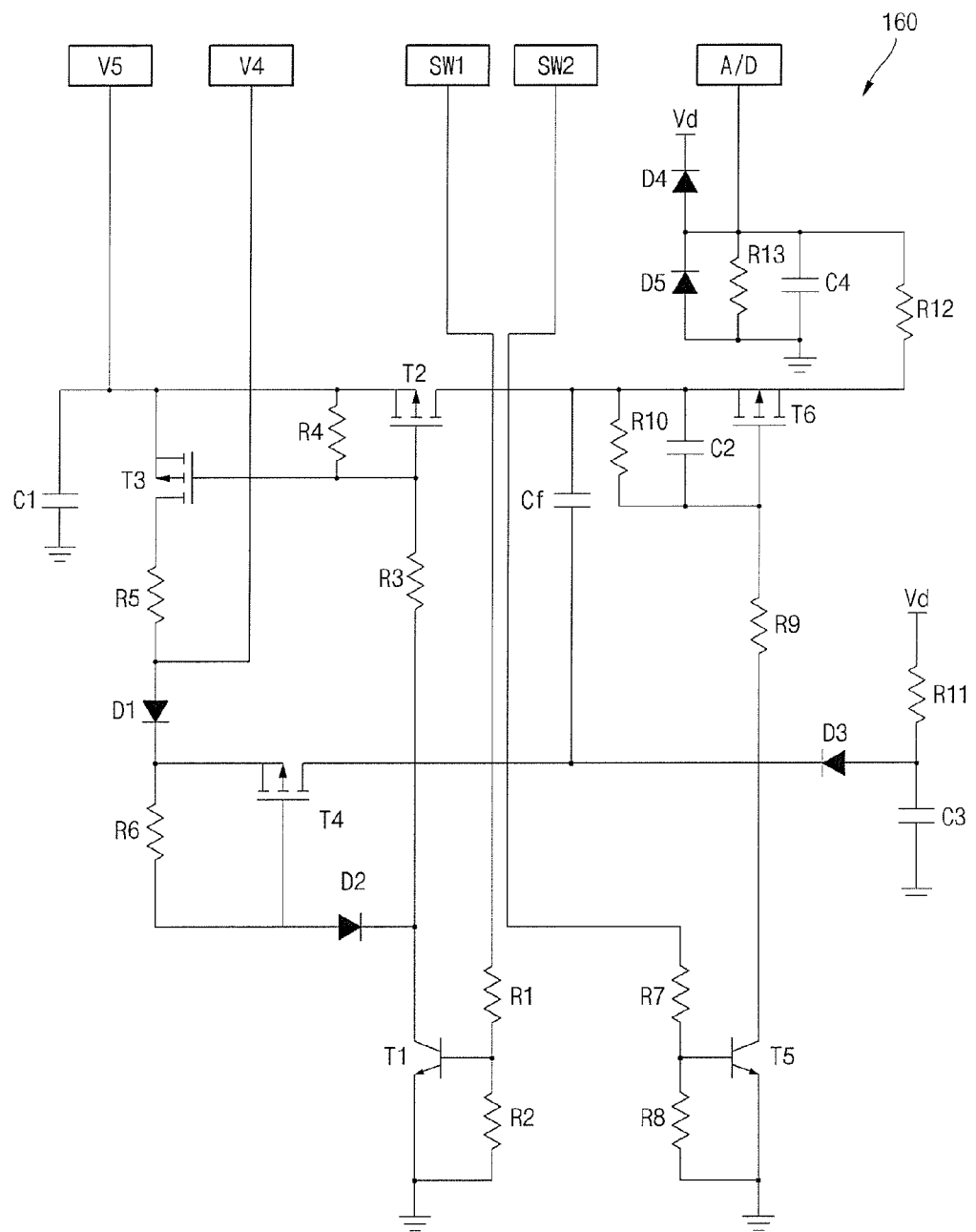
FIG. 2 is a circuit diagram illustrating the structure of an analog switch of the battery pack illustrated in FIG. 1.

FIG. 1 a block diagram illustrating a structure of a battery pack according to an embodiment of the present invention, and FIG. 2 is a circuit diagram illustrating a structure of an analog switch of the battery pack illustrated in FIG. 1.

Referring to FIG. 1, the battery pack 100 according to the illustrated embodiment includes a plurality of rechargeable battery cells 110 coupled in series to each other, a voltage sensing and balancing circuit 120 for performing voltage sensing and balancing operations of the battery cells 110, and a controller 130.

Here, each of the respective battery cells 110 may be a lithium ion battery chargeable to a voltage of approximately 4.2 V, but embodiments of the present invention are not limited thereto. The voltage sensing and balancing circuit 120 may include various types of analog front ends manufactured for use with lithium ion batteries, but embodiments of the present invention are not limited thereto. In addition, the controller 130 may include various types of microcomputers manufactured for use with lithium ion batteries, but embodiments of the present invention are not limited thereto.

Further, the voltage sensing and balancing circuit 120 supplies power to the controller 130 and provides an analog-to-digital (A/D) converter of the controller 130 with data in the form of voltages detected from, for example, four battery cells 110. The controller 130 provides charge/discharge control signals and a balancing control signal corresponding to the data processed by a program (for example, a predetermined program) or algorithm (for example, data corresponding to the voltages detected from the battery cells 110) to the voltage sensing and balancing circuit 120.

The battery pack 100 includes a discharging terminal 141 for discharging the battery cells 110, a charging terminal 142 for charging the battery cells 110, a communication terminal 143 used for single wire communication with an external device, and a negative electrode terminal 144 for charging or discharging the battery cells 110.

Here, the discharging terminal 141 and the charging terminal 142 are electrically coupled to positive electrodes of the battery cells 110, the negative electrode terminal 144 is electrically coupled to negative electrodes of the battery cells 110, and the communication terminal 143 is electrically coupled to the controller 130, respectively.

In addition, the battery pack 100 may further include a fuse 151 coupled between the battery cells 110 and the charging terminal 142 to prevent overcharging the battery cells 110. Referring to FIG. 1, the fuse 151 further includes a heat resistor 152 and a switch 153. The switch 153 may be turned on or off by the control signals of the controller 130. In the illustrated embodiment, the fuse 151 is used as the overcharge preventing member, but embodiments of the invention are not limited thereto. In other embodiments, for example, the overcharge preventing member may include a plurality of field effect transistors.

The battery pack 100 according to the illustrated embodiment includes five battery cells 110 coupled in series with each other. The voltage sensing and balancing circuit 120 in the illustrated embodiment of FIG. 1, however, is designed to detect voltages of only four battery cells 110. In other words, the voltage detected from the fifth battery cell 110 cannot be detected without changing circuits, such as currently developed voltage sensing and balancing circuits.

To enable the voltage detection from the fifth battery cell 110, the battery pack 100 according to the illustrated embodiment further includes an analog switch 160. The analog switch 160 is coupled in parallel between positive and negative electrodes of the fifth battery cell 110. The analog switch 160 stores a voltage of the fifth battery cell 110 and transfers the same to an A/D converter (not shown) of the controller 130.

Referring to FIG. 2, the analog switch 160 includes a first transistor T1 coupled to the controller 130 to perform a switching operation along with a second transistor T2, a third transistor T3, and a fourth transistor T4 that are driven by the first transistor T1. In addition, the analog switch 160 includes a fifth transistor T5 coupled to the controller 130 to perform a switching operation, and a sixth transistor T6 that is driven by the fifth transistor T5.

The first transistor T1 receives a first switching signal SW1 from the controller 130. Here, a first resistor R1 is coupled between a control electrode of the first transistor T1 and the controller 130, and a second resistor R2 is coupled between the control electrode of the first transistor T1 and a first electrode of the first transistor T1. In addition, the first electrode of the first transistor is coupled to ground. Accordingly, the first switching signal SW1 is divided by the first resistor R1 and the second resistor R2 to then be applied to the control electrode of the first transistor T1.

A control electrode of the second transistor T2 is coupled to a second electrode of the first transistor T1 through a third resistor R3. Therefore, the second transistor T2 is turned on in response to a signal to the control electrode of the second transistor T2 when the first transistor T1 is turned on. Further, a fourth resistor R4 is coupled between the control electrode of the second transistor T2 and the first electrode of the second transistor T2. The first electrode of the second transistor T2 is coupled to a positive terminal V5 of the fifth battery cell 110. In addition, a second electrode of the second transistor T2 is coupled to a flying capacitor Cf, and applies a voltage of the positive terminal V5 to the flying capacitor Cf when the second transistor T2 is turned on.

A control electrode of the third transistor T3 is coupled to the second electrode of the first transistor T1 through the third resistor R3. Therefore, the third transistor T3 is also turned on when the first transistor T1 is turned on. A first electrode of the third transistor T3 is coupled to the positive terminal V5 of the fifth battery cell 110. Here, the voltage of the positive terminal V5 is stored through a first capacitor C1, to then be applied to the third transistor T3. In addition, a second electrode of the third transistor T3 is coupled to the fourth transistor T4 via a fifth resistor R5 and a first diode D1. Here, the first diode D1 prevents a current from flowing from the flying capacitor Cf through the fourth transistor T4.

A control electrode of the fourth transistor T4 is coupled to the second electrode of the first transistor T1 through a second diode D2. In addition, a first electrode of the fourth transistor T4 is coupled to the control electrode of the fourth transistor T4 through a sixth resistor R6. Therefore, if a current flows through the sixth resistor R6, the fourth transistor T4 is turned on. In addition, a potential of a node coupled between the first diode D1 and the sixth resistor R6 is applied to the flying capacitor Cf through the fourth transistor T4. Meanwhile, the second diode D2 cuts off a surge current applied through the ground.

A first electrode of the flying capacitor Cf is coupled to the second electrode of the second transistor T2 and a first electrode of the sixth transistor T6. In addition, a second electrode of the flying capacitor Cf is coupled to a second electrode of the fourth transistor T4. Accordingly, the second electrode of the flying capacitor is coupled to a negative terminal V4 of the fifth battery cell 110 through the first diode D1 and the fourth transistor T4. Therefore, a voltage corresponding to the sum of the voltage of the fifth battery cell 110 and a driving voltage of the first diode D1 is applied to the flying capacitor Cf.

In addition, the second electrode of the flying capacitor Cf is coupled to a third capacitor C3 through a third diode D3. The third capacitor C3 is coupled to a voltage supply Vd through an eleventh resistor R11 and stores a voltage of the voltage supply Vd. An anode of the third diode D3 is coupled to the third capacitor C3, and a cathode is coupled to the second electrode of the flying capacitor Cf. Accordingly, the voltage Vd stored in the third capacitor C3 and a reverse driving voltage of the third diode D3 are applied to the second electrode of the flying capacitor.

Therefore, the forward driving voltage of the first diode D1 coupled to the second electrode of the flying capacitor Cf is offset by the reverse driving voltage of the third diode D3. In this way, a driving voltage difference dependent on the temperature characteristic of the first diode D1 can be eliminated. In addition, in order to make the third diode D3 and the first diode D1 demonstrate the same temperature characteristics, the first diode D1 and the third diode D3 may be packaged as a single set. For example, the first and third diodes D1 and D3 may be in the same package.

A control electrode of the fifth transistor T5 is coupled to the controller 130 through a seventh resistor R7. In addition, an eighth resistor R8 is coupled between the control electrode of the fifth transistor T5 and the first electrode of the fifth transistor T5. Further, a first electrode of the fifth transistor T5 is coupled to ground. Accordingly, a second switching signal SW2 is divided by the seventh resistor R7 and a eighth resistor R8 to then be applied to the control electrode of the fifth transistor T5.

The control electrode of the sixth transistor T6 is coupled to a second electrode of the fifth transistor T5 through a ninth resistor R9. In addition, the control electrode of the sixth transistor T6 is coupled to the first electrode of the sixth transistor T6 through a tenth resistor R10 and a second capacitor C2 coupled in parallel to each other. The tenth resistor R10 and the second capacitor C2 increase a gate-source voltage of the sixth transistor T6 with a transient time, thereby preventing the sixth transistor T6 from being turned on at the same time with the second transistor T2 and the fourth transistor T4.

A second electrode of the sixth transistor T6 is coupled to parallel branches of a thirteenth resistor R13 and a fourth capacitor C4 through a twelfth resistor R12. The fourth capacitor C4 is coupled between the twelfth resistor R12 and ground to store the voltage applied from the sixth transistor T6, and applies the same to an A/D converter (A/D) of the controller 130. The thirteenth resistor R13 and the fourth capacitor C4 allow the voltage applied from the sixth transistor T6 to be applied to the A/D converter (A/D) with a transient time.

A fourth diode D4 having an anode coupled to the thirteenth resistor R13 and a cathode coupled to a voltage supply Vd cuts off a surge current applied from the voltage supply Vd. A fifth diode D5 is coupled in parallel to both terminals of the thirteenth resistor R13. An anode of the fifth diode D5 is coupled to ground, and a cathode thereof is coupled to the anode of the fourth diode D4, thereby compensating for a driving voltage of the fourth diode D4 when the surge current is applied. In such a manner, temperature dependence of the driving voltage of the fourth diode D4 can be offset. Further, in order to make the fifth diode D5 and the fourth diode D4 demonstrate the same temperature characteristics, the fourth diode D4 and the fifth diode D5 may be packaged as a single set.

In addition, referring to FIG. 1, voltage dividing resistors 161a and 161b are coupled between a discharging terminal 141 and a negative electrode terminal 144, and the voltage dividing resistors 161a and 161b output the overall voltage of the battery pack 100 to the controller 130.

Hereinafter, the operation of the analog switch of the battery pack according to embodiments of the present invention will be described.

Figure 3:
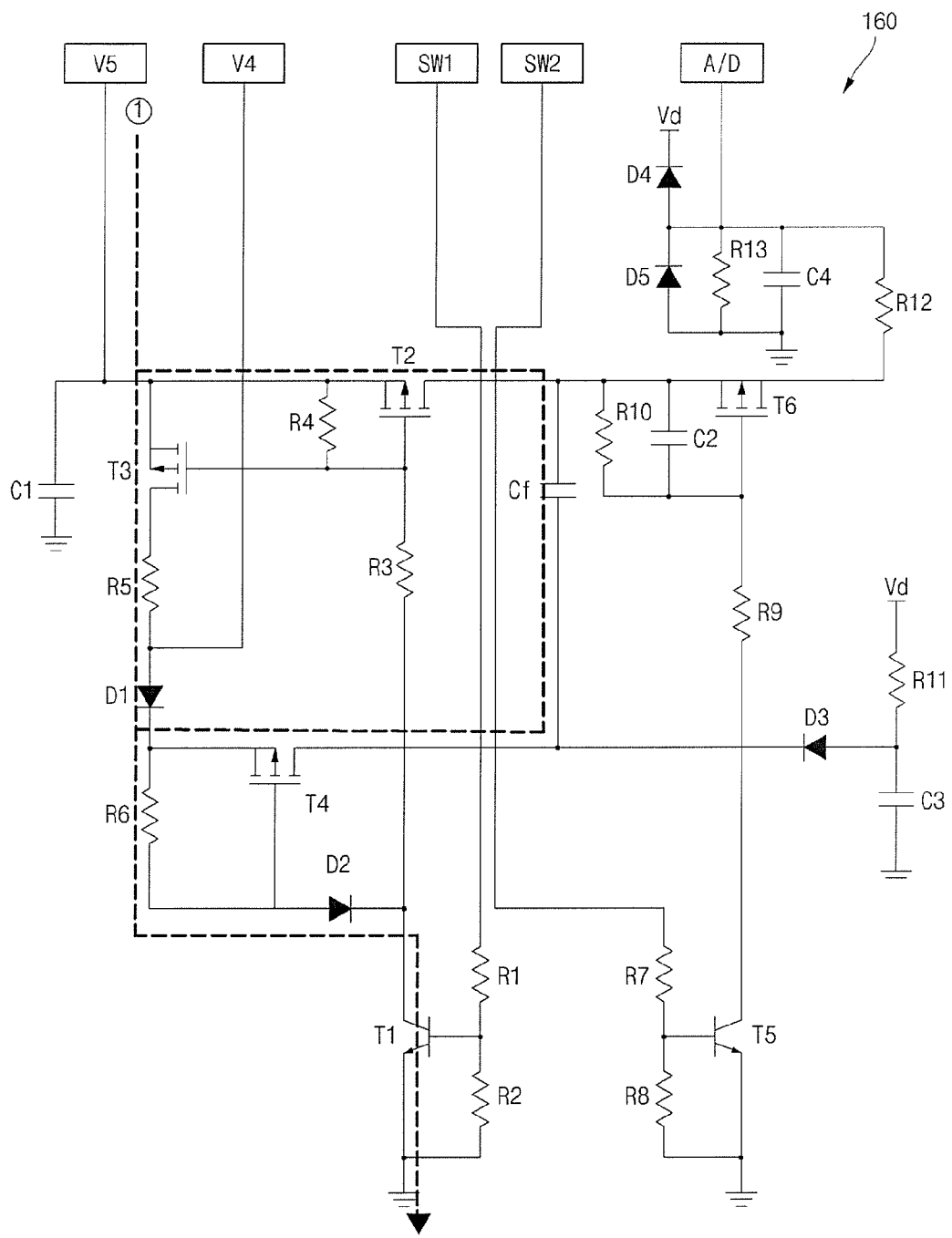
FIGS. 3 and 4 are circuit diagrams illustrating the operation of the analog switch of the battery pack illustrated in FIG. 1.
Figure 4:
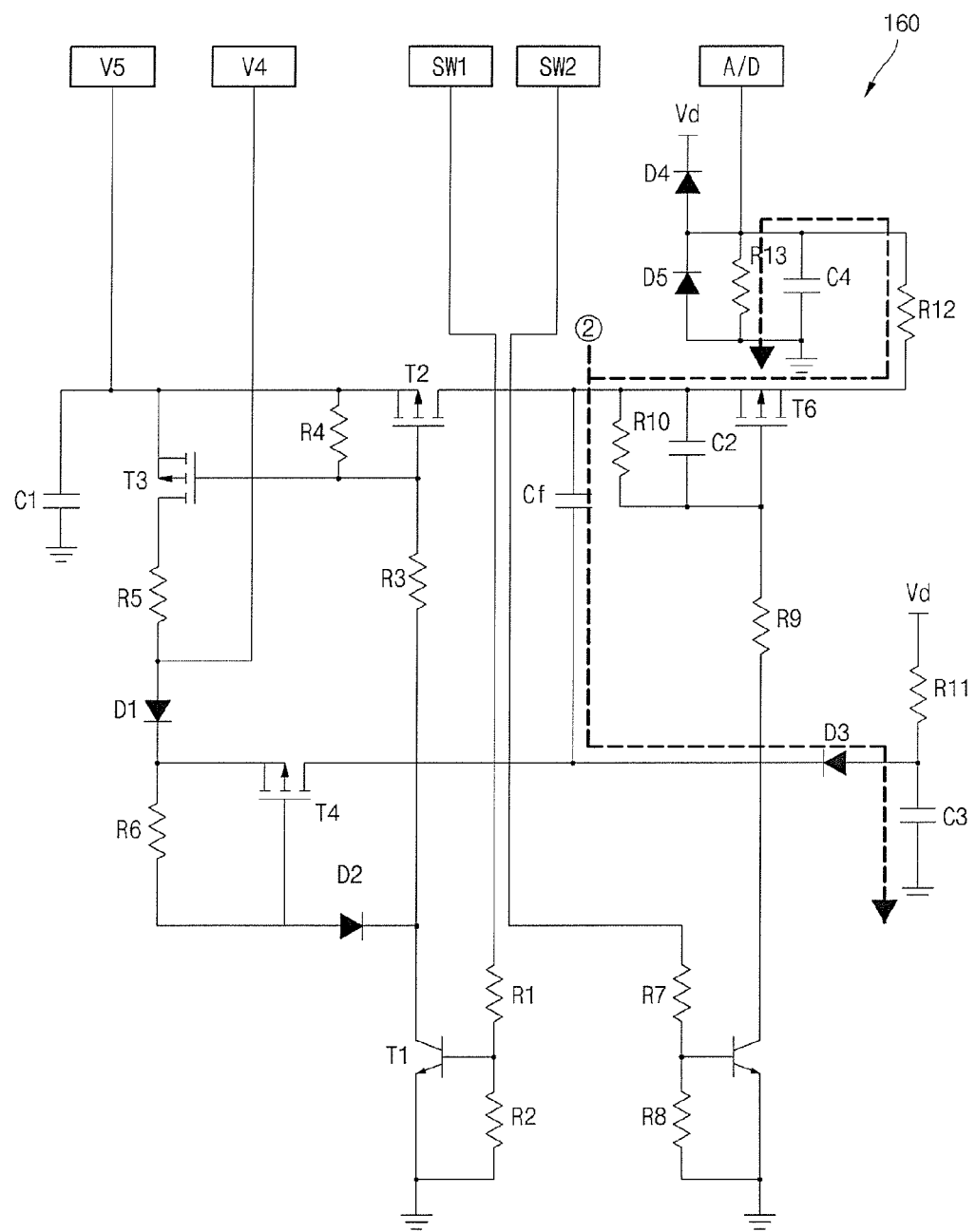

FIGS. 3 and 4 are circuit diagrams illustrating the operation of the analog switch of the battery pack illustrated in FIG. 1.

Referring to FIG. 3, a voltage of the fifth battery cell 110 is stored in the flying capacitor Cf of the analog switch 160, as indicated by line ①. First, when a first switching signal SW1 is applied, a voltage of the second resistor R2 is applied to the control electrode of the first transistor T1 to turn on the first transistor T1. The current flowing through the first and second electrodes of the first transistor T1 allows a voltage to be applied to control electrodes of the second transistor T2 and the third transistor T3 and turn on the second and third transistors T2 and T3.

As a result, a potential of the positive terminal V5 of the fifth battery cell 110 is transferred to the first electrode of the flying capacitor Cf through the second transistor T2 along the line ①. In addition, a potential of the negative terminal V4 of the fifth battery cell 110 reaches the second electrode of the flying capacitor Cf along the first diode D1 and the fourth transistor T4. Therefore, a voltage corresponding to ((V5−V4)+Vd1) is stored across the flying capacitor Cf. Here, the (V5−V4) is a voltage of the fifth battery cell 110, and Vd1 is a forward driving voltage of the first diode D1.

Referring to FIG. 4, the voltage of the fifth battery cell 110 stored in the flying capacitor Cf of the analog switch 160 is transferred to the A/D converter, as indicated by line ②. First, when a second switching signal SW2 is applied, the fifth transistor T5 is turned on. The current flowing through the first and second electrodes of the fifth transistor T5 allows a voltage to be applied to the sixth transistor T6 to turn on the sixth transistor T6. Here, the sixth transistor T6 is turned on with a transition time according to the time constant of the tenth resistor R10 and the second capacitor C2.

As the sixth transistor T6 is turned on, a potential of the first electrode of the flying capacitor Cf is transferred to the twelfth resistor R12 to then become ((V5−V4)+Vd1)+(Vd−Vd3). Here, Vd is a voltage of the voltage supply Vd, which is stored in the third capacitor C3, and Vd3 is a reverse driving voltage of the third diode D3. If the reverse driving voltage of the third diode D3 is equal to the forward driving voltage Vd1 of the first diode D1, the potential of the first electrode of the flying capacitor Cf is ((V5−V4)+Vd). Thus, the term associated with the diode driving voltage is removed. In addition, the potential is divided by the twelfth resistor R12 and the thirteenth resistor R13, and the voltage of the thirteenth resistor R13 is finally transferred to the A/D converter. Here, the thirteenth resistor R13 and the fourth capacitor C4 apply the voltage to the A/D converter with a transient time.

Meanwhile, the fourth diode D4 prevents a surge current from being applied from the voltage supply Vd, and the fifth diode D5 offsets a forward driving voltage of the fourth diode D4. Accordingly, temperature dependence of voltages measured from a battery cell can be compensated for and the voltages can be applied to the A/D converter in a stable manner.

Although arrangements and actuation mechanisms in the battery pack according to the present invention have been illustrated through particular embodiments, it should be understood that many variations and modifications may be made in those embodiments within the scope of the present invention by selectively combining all or some of the illustrated embodiments herein described.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. An analog switch comprising:
   a first input configured to conductively couple to a positive terminal of a battery such that the coupling from the positive terminal of the battery to the first input is configured to conduct current;
   a second input configured to conductively couple to a negative terminal of the battery such that the coupling from the negative terminal of the battery to the second input is configured to conduct current;
   an output configured to conductively couple to an analog-to-digital (A/D) converter such that the coupling from the A/D converter to the output is configured to conduct current;
   a flying capacitor having a positive terminal conductively coupled to the first input through a first coupling and a negative terminal conductively coupled to the second input through a second coupling such that the first coupling from the first input to the positive terminal of the flying capacitor is configured to conduct current and the second coupling from the second input to the negative terminal of the flying capacitor is configured to conduct current;
a first diode along the second coupling and dividing the second coupling into a third coupling from the second input to the first diode and a fourth coupling from the first diode to the negative terminal of the flying capacitor, the first diode comprising an anode conductively coupled to the second input and a cathode conductively coupled to the negative terminal of the flying capacitor such that the third coupling from the second input to the anode of the first diode is configured to conduct current and the fourth coupling from the cathode of the first diode to the negative terminal of the flying capacitor is configured to conduct current; and
a second diode comprising an anode conductively coupled to a first capacitor for storing a supply voltage, and a cathode conductively coupled to the negative terminal of the flying capacitor such that the coupling from the first capacitor to the anode of the second diode is configured to conduct current and the coupling from the cathode of the second diode to the negative terminal of the flying capacitor is configured to conduct current.

2. The analog switch of claim 1, wherein the first diode and the second diode have substantially the same temperature characteristics.

3. The analog switch of claim 1, further comprising:
a third input configured to receive a first control signal for controlling voltage sensing of the battery; and
a fourth input configured to receive a second control signal for controlling voltage transfer to the A/D converter.

4. The analog switch of claim 3, wherein the flying capacitor is configured to store a voltage corresponding to a sum of a voltage between the positive and negative terminals of the battery and a forward voltage of the first diode in response to the first control signal.

5. The analog switch of claim 4, wherein the flying capacitor is configured to transfer a voltage corresponding to a sum of the voltage between the positive and negative terminals of the battery, the forward voltage of the first diode, and the supply voltage minus a reverse voltage of the second diode to the A/D converter in response to the second control signal.

6. The analog switch of claim 5, wherein the forward voltage of the first diode is substantially the same in magnitude as the reverse voltage of the second diode.

7. The analog switch of claim 3, further comprising:
a first transistor comprising a first electrode coupled to ground, a second electrode, and a control electrode coupled to the third input;
a second transistor comprising a first electrode coupled to the first input, a second electrode coupled to the positive terminal of the flying capacitor, and a control electrode coupled to the second electrode of the first transistor; and
a third transistor comprising a first electrode coupled to the cathode of the first diode, a second electrode coupled to the negative terminal of the flying capacitor, and a control electrode coupled to the second electrode of the first transistor.

8. The analog switch of claim 7, further comprising a first voltage divider comprising:
a first resistor coupled between the control electrode of the first transistor and the third input; and
a second resistor coupled between the control electrode of the first transistor and the first electrode of the first transistor.

9. The analog switch of claim 7, further comprising:
a fourth transistor comprising a first electrode coupled to ground, a second electrode, and a control electrode coupled to the fourth input; and
a fifth transistor comprising a first electrode coupled to the positive terminal of the flying capacitor, a second electrode coupled to the output, and a control electrode coupled to the second electrode of the fourth transistor.

10. The analog switch of claim 9, further comprising a second voltage divider comprising:
a third resistor coupled between the control electrode of the fourth transistor and the fourth input; and
a fourth resistor coupled between the control electrode of the fourth transistor and the first electrode of the fourth transistor.

11. The analog switch of claim 7, further comprising a second capacitor coupled to the first input.

12. The analog switch of claim 1, wherein the first diode and the second diode are in a same package.

13. A battery pack comprising:
a secondary battery cell;
a controller comprising an analog-to-digital (A/D) converter, and configured to control charging and discharging of the secondary battery cell; and
an analog switch configured to sense and store a voltage of the secondary battery cell and to transfer the voltage to the A/D converter of the controller, the analog switch comprising:
a flying capacitor having a positive terminal conductively coupled to a positive terminal of the secondary battery cell through a first coupling and a negative terminal conductively coupled to a negative terminal of the secondary battery cell through a second coupling such that the first coupling from the positive terminal of the secondary battery cell to the positive terminal of the flying capacitor is configured to conduct current and the second coupling from the negative terminal of the secondary battery cell to the negative terminal of the flying capacitor is configured to conduct current;
a first diode along the second coupling and dividing the second coupling into a third coupling from the negative terminal of the secondary battery cell to the first diode and a fourth coupling from the first diode to the negative terminal of the flying capacitor, the first diode comprising an anode conductively coupled to the negative terminal of the secondary battery cell and a cathode conductively coupled to the negative terminal of the flying capacitor such that the third coupling from the negative terminal of the secondary battery cell to the anode of the first diode is configured to conduct current and the fourth coupling from the cathode of the first diode to the negative terminal of the flying capacitor is configured to conduct current; and
a second diode comprising an anode conductively coupled to a first capacitor for storing a supply voltage, and a cathode conductively coupled to the negative terminal of the flying capacitor such that the coupling from the first capacitor to the anode of the second diode is configured to conduct current and the coupling from the cathode of the second diode to the negative terminal of the flying capacitor is configured to conduct current.

14. The battery pack of claim 13, wherein the first diode and the second diode have substantially the same temperature characteristics.

15. The battery pack of claim 13, wherein the first diode and the second diode are in a same package.

* * * * *